(12) United States Patent
Chang et al.

(10) Patent No.: US 8,400,227 B2
(45) Date of Patent: Mar. 19, 2013

(54) CLOCK GENERATOR

(75) Inventors: Chiao-Ling Chang, Taipei County (TW); Ying-Hsi Lin, Hsin Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/945,308

(22) Filed: Nov. 12, 2010

(65) Prior Publication Data
US 2011/0115570 A1 May 19, 2011

(30) Foreign Application Priority Data
Nov. 13, 2009 (TW) .............................. 98138650 A

(51) Int. Cl.
*H03L 7/099* (2006.01)

(52) U.S. Cl. ............ 331/185; 331/176; 331/16; 331/34; 327/156

(58) Field of Classification Search .................... 331/16, 331/34, 185; 327/156
See application file for complete search history.

(56) References Cited

U.S. PATENT DOCUMENTS

| | | | |
|---|---|---|---|
| 5,180,995 A | 1/1993 | Hayashi et al. | |
| 5,889,441 A | 3/1999 | Inn | |
| 5,973,524 A * | 10/1999 | Martin | 327/156 |
| 5,994,971 A | 11/1999 | Edwards | |
| 6,337,605 B1 | 1/2002 | Divoux | |
| 6,856,525 B2 | 2/2005 | Wallis | |
| 6,900,676 B1 | 5/2005 | Tamura | |
| 7,078,977 B2 * | 7/2006 | Maneatis | 331/16 |
| 7,355,482 B2 | 4/2008 | Meltzer | |
| 2003/0090330 A1 | 5/2003 | Sakurai et al. | |
| 2006/0181361 A1 | 8/2006 | Van De Gevel et al. | |

FOREIGN PATENT DOCUMENTS
TW    I242118    10/2005

OTHER PUBLICATIONS

Sundaresan et al., "Process and Temperature Compensation in a 7-MHz CMOS Clock Oscillator," IEEE Journal of Solid-State Circuits, No. 41, No. 2, Feb. 2006, pp. 443-0442.

* cited by examiner

*Primary Examiner* — Arnold Kinkead
(74) *Attorney, Agent, or Firm* — Muncy, Geissler, Olds and Lowe, PLLC

(57) ABSTRACT

A clock generator is provided, capable of automatically adjusting an output clock when process, voltage, or temperature variation occurs. The clock generator includes a current generator, for generating a first current and a second current according to a bias signal, an oscillator, coupled to the current generator, for generating a clock signal according to the first current, a frequency detector, coupled to the oscillator, for generating a control signal according to the clock signal and a reference signal, and a bias voltage adjuster, coupled to the current generator and the frequency detector, for adjusting the bias signal according to the control signal. When the signal frequency of the clock signal changes, the bias signal corresponds to the bias voltage adjuster, to adjust the first current and the second current.

11 Claims, 3 Drawing Sheets

CLOCK GENERATOR

BACKGROUND OF THE INVENTION (a) Field of the Invention

The present invention relates to a clock generator, and more particularly, to a clock generator that is substantially immune from the influence of manufacturing process, supply voltage, and temperature.

(b) Description of the Related Art

The compensation correction circuits of manufacturing process, voltage, and temperature are used to stabilize variables and control oscillator. The oscillator in a different environment can output accurate frequency, immune from the influence of environment and manufacturing process.

The general of compensation practice is to use another oscillator to detect changes in the environment, then the detection of the result is transmitted to compensate the circuit. This method requires a total of two oscillators which increase consumption of area and power. If these two oscillators mismatch, the detected result could be inaccurate, making the output frequency different from the design. In addition, the compensation circuit controls the current source to adjust the output frequency of the oscillator, but the current leakage of the transistor in the advanced manufacturing process would be a problem in this practice. It is more difficult to perform the matching between the two oscillators if the current of the current source controlled by the compensation circuit is extremely small.

Another compensation practice is to use differences of the temperature coefficient to compensate. In order to generate appropriate temperature coefficient, the hybrid concentration of electronic and electric hole should be adjusted during the production process. In the actual production of on the need more than one procedure will increase production costs. During the production process, if the process has drift, it cannot produce the correct temperature coefficient, it will lack repression to process variations. Therefore, the oscillator is made from the charge and discharge of resistors and capacitors, each resistor will need a positive temperature coefficient of the resistor and a negative temperature coefficient of the resistor, to connect in series to couple to offset the impact of temperature on the oscillation frequency. However, if the production in the process drifts, then the resistor will still be affected by temperature, so the precision of output frequency will be reduced. If the oscillator couples more groups such resistors, the repression to process variations will be worse. At low frequency, the output frequency precision is more easily influenced by temperature because of the requirement of the larger resistor.

However, there uses the bandgap reference voltage regulator to have stable voltage to suppress the impact of voltage variability, and reduces effects from temperature and process variation with internal use of the temperature/process circuit. For high precision of the output frequency, the two circuits need more power consumption of several mA. If it is used for low power applications, it can not achieve high precision output.

BRIEF SUMMARY OF THE INVENTION

One object of the present invention is to provide a clock generator with economizing on ping and the generated clock signal that is substantially immune from the influence of manufacturing process, voltage drift, and temperature.

One object of the present invention is to provide a clock generator with cost saving.

One object of the present invention is to provide a clock generator with improving the precision of the output frequency.

One object of the present invention is to provide a clock generator with reducing consumption of power.

One embodiment of the invention discloses a clock generator. The clock generator comprises: a current generator, for generating a first current and a second current according by a bias signal; an oscillator, coupled to the current generator, for generating a clock signal according to the first current; a frequency detector, coupled to the oscillator, for generating a control signal according to the clock signal and a reference signal; and a bias voltage adjuster, coupled to the current generator and the frequency detector, for adjusting the bias signal according to the control signal; wherein, when the signal frequency of the clock signal changes, the bias signal corresponds to the bias voltage adjuster, to adjust the first current and the second current.

The present invention adjusts the passive components and controls the input of the oscillator, that can be obtained with high precision output frequency under variations of different temperature, manufacturing process and voltage. This method in the circuit produced without the additional concentration of electron and hole which can reduce cost. And it can control high resolution to achieve high precision output frequency with low power consumption according to adjust the passive components to control the output. It is suitable for low-power product applications.

DETAILED DESCRIPTION OF THE INVENTION

Figure 1:
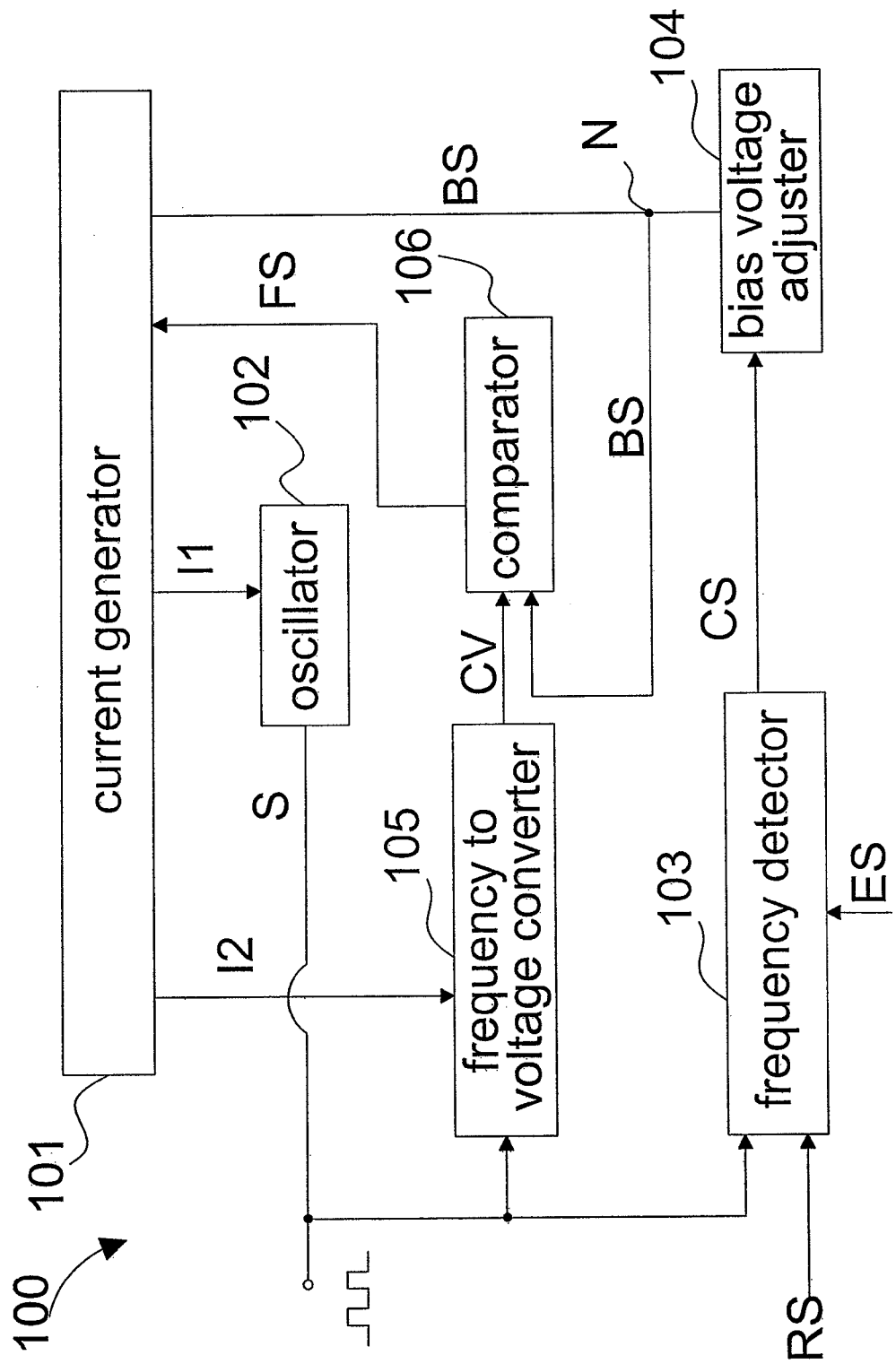
FIG. 1 shows a schematic diagram illustrating a clock generator according to a first embodiment of the invention.

First of all, please refer to FIG. 1, which shows a schematic diagram illustrating the clock generator according to a first embodiment of the invention. As shown in this figure, the clock generator 100 includes a current generator 101, an oscillator 102, a frequency detector 103, a bias voltage adjuster 104, a frequency to voltage converter 105, and a comparator 106.

The current generator 101 couples to the oscillator 102, the bias voltage adjuster 104, and the comparator 106. The current generator 101 generates the current I1 and I2 according to one of the output of the bias signal BS. Among them, the oscillator 102 generates a clock signal S by the current I1 after the oscillator 102 receives the current I1. The frequency to voltage converter 105 couples to the current generator 101 to receive the current I2 and the clock signal S. The current I2 and the clock signal S convert by the frequency to voltage converter 105 and output a converted voltage CV to the comparator 106. The comparator 106 couples to the voltage frequency converter 105 and the current generator 101. The comparator 106 is used to compare the bias signal BS of the node N with the converted voltage CV, to generate the feedback signal FS to the current generator 101.

Following the operation of this embodiment will make a more detailed explanation of the principle. When the clock generator 100 is in the initial state, the current generator 101 according to the bias signal BS outputted by the bias voltage adjuster 104 generates the current I1 and I2. Then, the oscillator 102 generates the clock signals S by the current I1, and the frequency to voltage converter 105 converts the clock signal S to a converted voltage CV by the current I2. Finally, the comparator 106 compares the converted voltage CV and the bias signal BS to adjust the current generator 101. Furthermore, when the comparator 106 compares the converted voltage CV is different from the bias signal BS, the feedback signal FS adjusts the current generator 101 to make the current I1 and I2 be adjusted, and changes the converted voltage CV, until the converted voltage CV and the bias signal BS are the same. In other words, when the converted voltage CV and the bias signal BS are the same, it shows that the oscillator 102 outputs the clock signal S can be stabilized at the designed frequency range.

In addition, in one embodiment, the clock generator 100 can add the frequency detector 103 to increase the frequency precision of the clock signal S. As shown in FIG. 1, the frequency detector 103 couples to the output end of the oscillator 102, and determines whether the frequency detector 103 detects the frequency of the clock signal S or not according to the enable signal ES. When the oscillator 102 generates that the frequency of the clock signal S is different from the reference clock signal RS, the frequency detector 103 detects the frequency difference and outputs the control signals CS to the bias voltage adjuster 104 to adjust the bias signal BS of the output of the bias voltage adjuster 104, to change the value of the current I1 and I2 until the output of the oscillator 102, the clock signal S, has the frequency the same as the reference clock signal RS. Thus, the clock generator 100 increases more frequency precision. In other words, the frequency detector 103 can be used to calibrate the frequency of the clock signal S. Wherein, in order to achieve more power saving purposes, after the frequency detector 103 calibrates frequency of the clock signal S, that is to say, when the clock signal S is oscillated to the target frequency, the clock generator 100 can disable the frequency detector 103 by the enable signal ES to save unnecessary power consumption.

We can understand from the above description, the first loop made by the current generator 101, the oscillator 102, the frequency to voltage converter 105, and the comparator 106 in the clock generator 100. The first loop can make the oscillator 102 for outputting the frequency of the clock signal S which oscillates in the designed frequency range. Furthermore, a second loop made by the current generator 101, frequency detector 103 and the bias voltage adjuster 104 can make the oscillator 102 for outputting the frequency of the clock signal S which oscillates on the target frequency.

Figure 2:
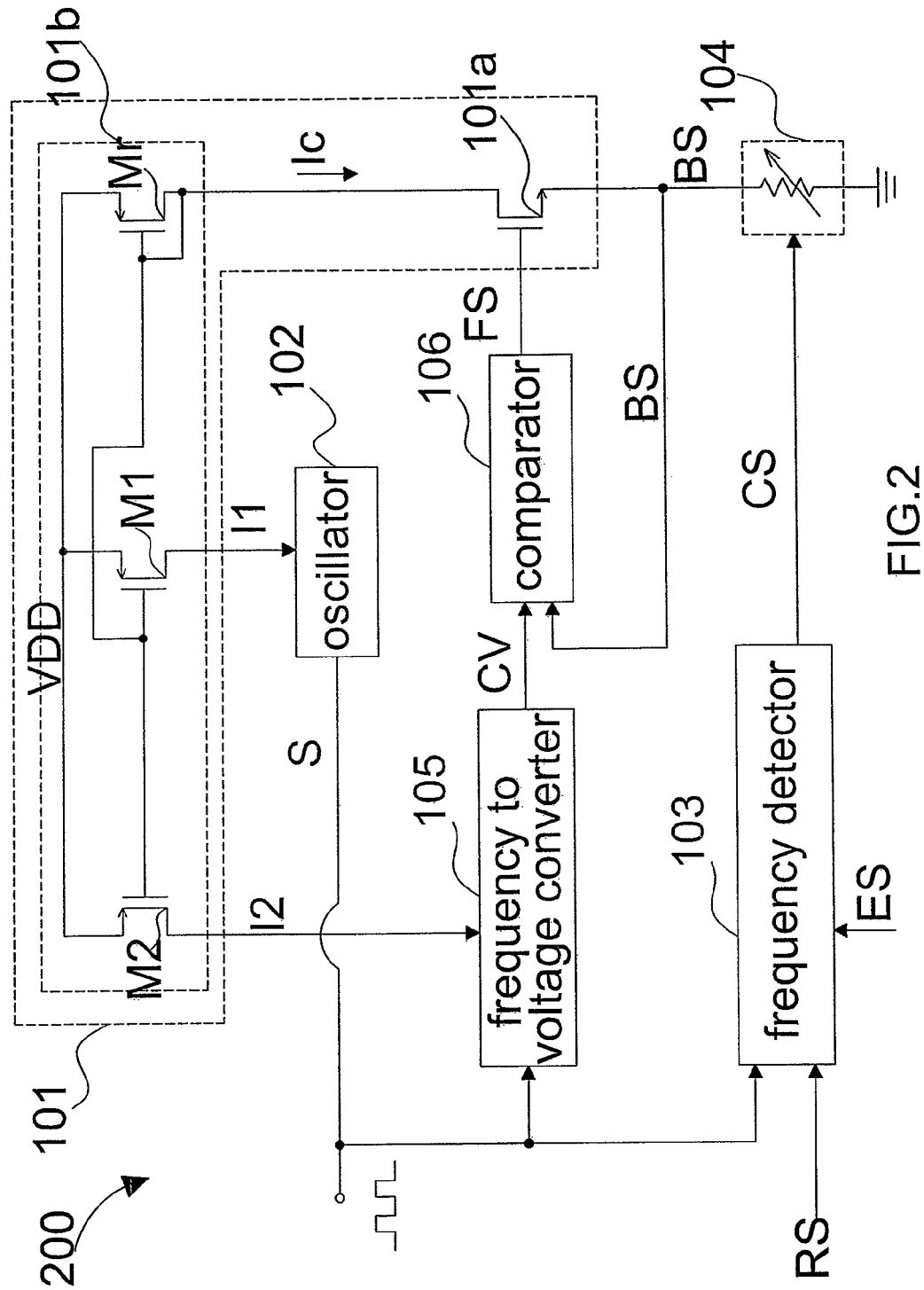
FIG. 2 shows a schematic diagram illustrating a clock generator according to a second embodiment of the invention.

Please refer to FIG. 2, which shows a schematic diagram illustrating the clock generator according to the second embodiment of the invention. The current generator 101 of the clock generator 200 includes a transistor 101a and a current mirror circuit 101b.

The transistor 101a couples to the comparator 106 and the bias voltage adjuster 104 to output a control current Ic according to the feedback signal FS. The current mirror circuit 101b couples to the transistor 101a to the current I1 and I2 by the control current Ic. Wherein, current mirror circuit 101b includes transistors Mr, M1 and M2.

The control current Ic flows to the current mirror circuit 101b, which the transistor M1 generates the current I1, the transistor M2 generates the current I2. When the aspect ratio of the transistor M1 is designed to be "b" times more than the aspect ratio of the transistor Mr, the first current I1 is substantially equal to "b" times more than the control current Ic. Similarly, when the aspect ratio of the transistor M2 is designed to be "a" times more than the aspect ration of the transistor Mr, the second current I2 is substantially equal to "a" times more than the control current Ic.

As shown in FIG. 2, the drain of the transistor M1 is coupled to the oscillator 102, wherein the oscillator 102 generates the clock signal S by the current I1 outputted from the transistor M1. The frequency to voltage converter 105 receives the current I2 and the clock signal S, converts the current I2 and the clock signal S to a converted voltage CV, and then the frequency to voltage converter 105 outputs the converted voltage CV to the comparator 106. The comparator 106 compares the converted voltage CV and the bias signal BS, outputs the feedback signal FS to the transistor 101a to form a loop system. Moreover, according to one embodiment, the bias voltage adjuster 104 can be implemented by a variable resistor, but not be limited to the present invention.

Figure 3:
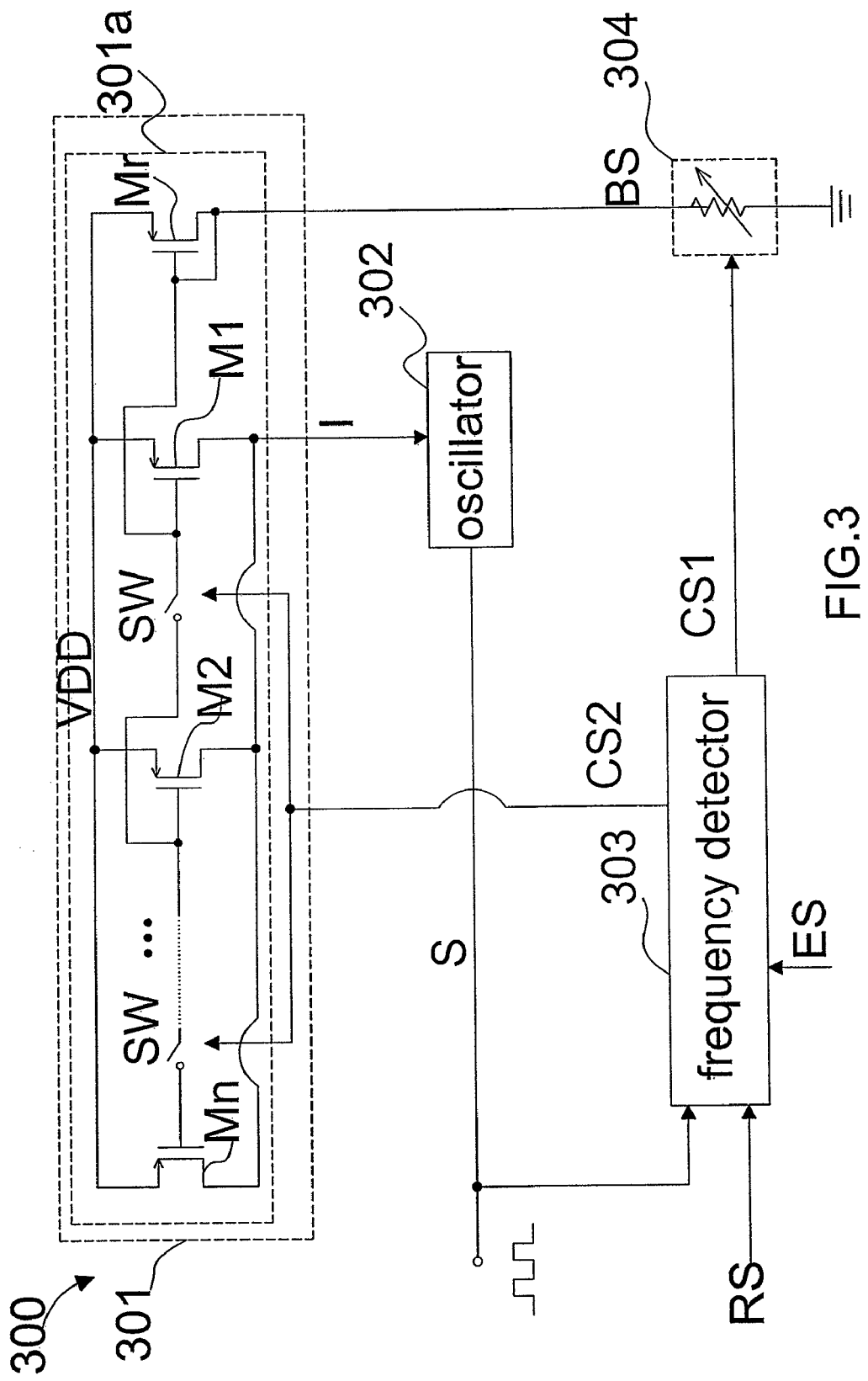
FIG. 3 shows a schematic diagram illustrating a clock generator according to a third embodiment of the invention.

Please refer to FIG. 3, which shows a schematic diagram illustrating the clock generator according to the third embodiment of the invention. As shown in FIG. 3, the clock generator includes a current generator 301, an oscillator 302, a frequency detector 303, and a bias voltage adjuster 304.

The oscillator 302 couples the frequency detector 303 and generates a clock signal S by the current I outputted from the current generator 301. The frequency detector 303 receives the clock signal S and the reference clock signal RS, and the frequency detector 303 determines whether the frequency detector 303 detects the frequency or not according to the enable signal ES. When the frequency detector 303 is enabled to detect the frequency difference between the clock signal S and the reference clock signal RS, outputs the control signal CS1 and CS2 to the bias voltage adjuster 304 and the current generator 301 according to the relationship between the clock signal S and the reference clock signal RS.

The bias voltage adjuster 304 couples to the frequency detector 303 to adjust the bias signal BS by the control signals CS1, to make the current generator 301 for generating the chance of the current I to correct the frequency of the oscillator 302. In other words, when the frequency of the clock signal S changes or the oscillator 302 outputs the oscillation frequency different from the reference clock signal RS, the bias voltage adjuster 304 corresponds to adjust the bias signal BS according to the changes of the frequency, to change the current I.

In one embodiment of the present invention, the current generator 301 also includes a current mirror circuit 301a and at least one switch SW. The current mirror circuit 301a comprises a reference transistor Mr and at least one output transistor Mn. In this embodiment, the output transistors with n M1~Mn, and n is the positive integer greater than 1. Among them, the reference transistor Mr is used to control the output current of the output transistors M1~Mn by the control current Ic.

The switch SW couples the gate of the output transistors M1~Mn and the gate of the reference transistor Mr. The switch SW is controlled to enable or disable by the control signal CS2. And the current generator 301 adjusts the current value according to the number of enabled switch SW.

To note that, the value of the current I is equal to the sum of the current of the drain of the output transistors M1~Mn that stands on the enabled state of the switch SW. In other words, if the enabled number of the switch SW is 3 by the control signal CS2, then the value of the current I is the sum of the current of the drain of the transistors M1~Mn. By changing the value of the current I to adjust the frequency of the clock signal S generated from the oscillator 302.

In one embodiment of the present invention, the bias voltage adjuster 304 can be satisfied by a variable resistor. In another embodiment, the bias voltage adjuster 304 also can be satisfied by the thermal compensation resistor to reduce the impact of temperature from oscillator 302.

Therefore, the current generator 301 generates the current I transmitted to the oscillator 302, and the oscillator 302 generates the clock signal S to the frequency detector 303. The frequency detector 303 outputs the control signal CS1 and CS2 to the bias voltage adjuster 304 and the current generator 301 respectively by the clock signal S and the reference clock signal RS, to adjust the resistance value of the bias voltage adjuster 304 and the number of the switch SW to change the value of the output current I transmitted from the current generator 301. To adjust the clock signal S generated by the oscillator 302, and thus achieve the effect of the frequency correction of the oscillator 302.

In conclusion, by means of the three feedback control mechanisms of the current generator, the oscillator, and the voltage adjuster, the value of the current generated by the current generator will be adjusted, to change the frequency generated by the oscillator. Furthermore, the clock signal outputted by the oscillator of the clock generator will not be substantially influenced by the manufacturing process, the supply voltage, and the temperature. The frequency generated by the oscillator is stable in the design frequency.

What is claimed is:

1. A clock generator, comprising:
   a current generator, for generating a first current according to a bias signal;
   an oscillator, coupled to the current generator, for generating a clock signal according to the first current;
   a frequency detector, coupled to the oscillator, for detecting the clock signal and a reference clock signal to output a first control signal; and
   a bias voltage adjuster, coupled between the current generator and the frequency detector, for outputting the bias signal according to the first control signal;
   wherein when the frequency of the clock signal changed, the bias voltage adjuster correspondingly adjusts the bias signal so that the current generator changes the first current;
   wherein the current generator comprises:
   a frequency to voltage converter, coupled to the current generator, for outputting a converted voltage according to a second current generated by the current generator and the clock signal; and
   a comparator, coupled to the frequency to voltage converter and the current generator, for outputting a feedback signal to the current generator according to the converted voltage and the bias signal.

2. The clock generator according to claim 1, wherein the current generator comprises:
   a transistor, coupled to the comparator and the bias voltage adjuster, for outputting a control current according to the feedback signal; and
   a current mirror circuit, coupled to the transistor, for generating the first current and the second current according to the control current.

3. The clock generator according to claim 2, wherein the transistor can be NMOS, PMOS, or other type transistor.

4. The clock generator according to claim 1, wherein the frequency detector further generates a second control signal to the current generator to change the first current.

5. The clock generator according to claim 4, wherein the current generator comprise a current mirror circuit, the second control signal controls a least one switch of the current mirror circuit to change the first current.

6. The clock generator according to claim 1, wherein the frequency detector determines whether the frequency detector detects the frequency or not according to an enable signal.

7. The clock generator according to claim 1, wherein the bias voltage adjuster is a variable resistor.

8. A clock generator, comprising:
   a current generator, for generating a first current according to a bias signal;
   an oscillator, coupled to the current generator, for generating a clock signal according to the first current;
   a frequency detector, coupled to the oscillator, for detecting the clock signal and a reference clock signal to output a first and a second control signals; and
   a bias voltage adjuster, coupled between the current generator and the frequency detector, for outputting the bias signal according to the first control signal;
   wherein when the signal frequency of the clock signal changed, the frequency detector correspondingly outputs the second control signal to the current generator to change the first current;
   wherein the clock generator further comprises:
   a current mirror circuit, having a reference transistor and a least one output transistor, the reference transistor controls the output transistor to output the current according to a control current; and
   at least one switch, coupled between the gate of the output transistor and the gate of the reference transistor, the switch is controlled whether the switch is enabled or not according to the second control signal to control the value of the first current.

9. The clock generator according to claim 8, wherein the bias voltage adjuster is a variable resistor.

10. The clock generator according to claim 8, wherein the switch is controlled whether the switch is enabled or not according to the second control signal, by the number of the enabled switch to adjust the value of the first current.

11. The clock generator according to claim 8, wherein the frequency detector determines whether the frequency detector detects the frequency or not according to an enable signal.

* * * * *